(12) United States Patent
Gillingham et al.

(10) Patent No.: US 6,768,659 B2
(45) Date of Patent: *Jul. 27, 2004

(54) CIRCUIT AND METHOD FOR REDUCING POWER USAGE IN A CONTENT ADDRESSABLE MEMORY

(75) Inventors: Peter Gillingham, Kanata (CA); Alan Roth, Austin, TX (US)

(73) Assignee: Mosaid Technologies Incorporated, Kanta (CA)

(*) Notice: Subject to any disclaimer, the term of this patent is extended or adjusted under 35 U.S.C. 154(b) by 0 days.

This patent is subject to a terminal disclaimer.

(21) Appl. No.: 10/060,100

(22) Filed: Jan. 31, 2002

(65) Prior Publication Data

US 2003/0123269 A1 Jul. 3, 2003

Related U.S. Application Data

(60) Provisional application No. 60/343,229, filed on Dec. 31, 2001.

(51) Int. Cl.[7] .............................................. G11C 15/00
(52) U.S. Cl. ........................ 365/49; 365/203; 711/108
(58) Field of Search .................... 365/49, 203; 711/108

(56) References Cited

U.S. PATENT DOCUMENTS

| | | | |
|---|---|---|---|
| 5,471,189 A | 11/1995 | Dietz et al. | |
| 5,517,441 A | 5/1996 | Dietz et al. | |
| 5,659,687 A | 8/1997 | Kim et al. | |
| 6,191,969 B1 | 2/2001 | Pereira | |
| 6,191,970 B1 | 2/2001 | Pereira | 365/49 |
| 6,243,280 B1 | 6/2001 | Wong et al. | 365/49 |
| 6,538,947 B2 * | 3/2003 | Ahmed et al. | 365/207 |
| 6,584,003 B1 * | 6/2003 | Kim et al. | 365/49 |

OTHER PUBLICATIONS

Zukowski, Charles A. and Shao–Yi Wang, "Use of Selective Precharge for Low Power on the Match Lines of Content–Addressable Memories", 0–8186–8099–7/97, 1997 IEEE.

* cited by examiner

*Primary Examiner*—Connie C. Yoha
(74) *Attorney, Agent, or Firm*—Kevin Pillay

(57) ABSTRACT

A content addressable memory (CAM) including a plurality of rows, each of the rows has a plurality of matchline segments having a plurality of CAM cells coupled thereto. A circuit is provided for precharging the matchline segments to a mismatch condition. For each segment a sense circuit detects a match and in response thereto enables a discharge path in a subsequent segment, to allow matches to be detected therein. This is propagated through all segments in a row to generate a search result for the row.

17 Claims, 9 Drawing Sheets

CIRCUIT AND METHOD FOR REDUCING POWER USAGE IN A CONTENT ADDRESSABLE MEMORY

This application claims the benefit of Provisional Application No. 60/343,229, filed Dec. 31, 2001.

The present invention relates generally to the field of content addressable memories (CAMs) and more particularly to a circuit and method for reducing power usage during search operations in a CAM.

BACKGROUND OF THE INVENTION

A CAM is a memory device in which data is accessed and modified based on the content of the stored data, rather than the location where the data is stored. In general, a typical CAM search operation involves receiving a search data word and comparing the search data word with all entries in the CAM to determine whether there exists a single match, a multiple match or a mismatch between the search data word and entries in the CAM. Each storage location in a row of a CAM is connected to a matchline that indicates a match or mismatch result of the comparison between the stored data word and the search word. All match lines indicating a match condition are typically processed by a priority encoder (PE) to determine a highest priority match address which is provided as an output of the CAM.

Each data word and match line combination has a unique N-bit address within the CAM. Accordingly, for any search cycle there may be up to $2^N$ match lines activated. The priority encoder is coupled to the match lines and generates an N-bit address corresponding to the highest priority active match line. This N-bit address may then be used, for example, as a pointer in an Internet Protocol (IP) routing table lookup, compression and decompression or fully associative cache memory implementations in microprocessor systems. Ternary CAMs are widely used in networking applications due to their ability to store logic "1", logic "0" as well as "don't care" states. There is an ever increasing demand for wider data width CAMSs. CAMs are commonly available in data widths (denoted by M) that are 72-bits and 144-bits and more recently 288-bits wide.

With increasing data widths, power or current consumption during search operations in the CAM becomes increasingly important. The reason for this may be explained as follows.

In a search operation, data is provided to the CAM for comparing to stored data. The CAM cells are normally designed such that a match between search data and stored data provides a non-conductive path, whereas a mis-match provides a conductive path. A row of CAM consists of cells coupled in parallel between common nodes called a match line (ML) and a tail line (TL). Each individual ML connects to M cells (where M is the number of bits or usually the data width). Typically, in a search operation, M-bit search data is provided to a search data path which consists of M search lines coupled to corresponding columns of CAM cells. All N-rows of the CAM simultaneously then compare the search data with the stored data in each cell-typically implemented as an exclusive-OR comparison block-and provide a result of his comparison to each match line associated with each row of the CAM. The result on the match line is then sensed, amplified and typically latched in order to provide a logic level result of the search operation.

There are two main sources of substantial power consumption during search operations in CAM's: power consumed by match lines and power consumed by search lines.

Conventionally, all match lines are precharged to a logic 'H' state (a match condition), and then the comparison with search data is allowed to pull match lines to a logic 'L' state (a miss condition).

In most CAM applications "misses" occur more frequently than "hits". Precharging match lines to a logic 'H' and discharging match lines to logic 'L' for misses tends to generate high power consumption due to the high current associated with charging and discharging all match lines for each search operation. In additions with an increased number of cells connected to each match line for wider-word CAM applications, the capacitance of match lines increases accordingly, which in turn increases the current required to charge and discharge the match lines.

Various solutions have been proposed for reducing the power consumed during search operations, such as segmenting match lines into multiple segments and activating segments sequentially based on match or miss results of previous segments, For example, a segmented match line architecture is described in U.S. Pat. No. 6,243,280 (Wong et al.)., wherein rows of the CAM are partitioned into a plurality of segments. For each match line, the first of the plurality of match line segments is precharged and a search operation is performed on the first segment. In case of a match in the first segment, the second match line segment is selectively precharged and searching proceeds to the second segment. If there is a match in the second segment, a third segment is precharged and searching proceeds in a similar manner until all segments of a match line have been searched. Precharging of a subsequent segment therefore only occurs in case of a match result in a previous segment. In the case of a match in all segments, selective precharging each segment to a logic 'H' however still requires a large current. Furthermore, a significant delay is introduced in the search time by having to wait for the selective precharge to occur in a segment before proceeding with the actual comparison in that segment.

U.S. Pat. No. 6,191,970 (Pereira) a match line is divided into multiple segments all of which are simultaneously precharged to a logic 'H' state prior to beginning a search operation. In addition, each CAM cell has an associated discharge circuit for selectively discharging its corresponding match line segment in response to a disable signal from a previous match line segment. A segment therefore is only discharged if the immediately preceding segment results in a miss while all subsequent segments remain precharged to a logic 'H'. As a result, the miss condition of one segment is propagated along the remainder of the row without discharging all other segments along the row. While this approach alleviates the problem of delays introduced by selectively precharging segments, the potential for high current consumption still remains, since all match lines must first be precharged to a logic 'H' state. In addition, the match detect of each segment must be synchronized to a clock signal, clocked since the match line precharges to a hit. As a result, either a number of internal clocks must be generated, or the system clock must be used which increases system latency. Finally, in order to prevent discharge before the segment is enabled a series coupled device is added to each CAM cell, thereby increasing chip area and slowing down the entire operation.

In an article entitled "Use of Selective Precharge for Low Power on the Match Lines of Content Addressable Memories" by Zukowski et al. IEEE 1997 there is described a method whereby a small segment of an overall match line is precharged and used to perform a partial comparison first and only if a match occurs in that first small segment is the remaining segment of the match line precharged and eventually searched. The article also suggests that theoretically the selective precharge technique could be extended to cover more than one stage, but the additional overhead, extra clock phases and additional buffering would not provide any large additional gains over the single stage selective precharge proposed therein. This approach does not consider the possibility of having multiple match line segments working sequentially but independently of clock cycles, providing a sufficiently fast process technology is available to implement the necessary circuitry. Furthermore, the approach discussed by Zukowski et al. still relies on a precharge to a logic 'H' state which can draw large amounts of current as previously explained.

Thus there is still a need for a CAM which is capable of consuming less power during search operations than conventional search techniques.

SUMMARY OF THE INVENTION

In accordance with the present invention there is provided a method for selectively enabling, during a search operation, at least one of a plurality of matchline segments within a row of a content addressable memory (CAM) array, each matchline segment having a plurality of CAM cells coupled thereto, the method comprising the steps of:

(a) setting the matchline segments to a first search result condition;

(b) evaluating a first matchline segment for a second search result condition; and (c) selectively enabling a second match line segment, in response to the second search result condition in the first matchline segment, so that said second search result condition can be detected thereat.

In accordance with another aspect of the invention there is provided a content addressable memory (CAM) including a plurality of rows, each of the rows comprising:

(a) a plurality of matchline segments having a plurality of CAM cells coupled thereto;

(b) a circuit for precharging the matchline segments to a first search result condition (miss);

each said segment including:

(i) a sense circuit for detecting a second result condition (hit) therein; and (ii) a circuit for enabling a discharge path in a subsequent segment, to detect said second search result condition therein(match).

BRIEF DESCRIPTION OF THE DRAWINGS

The features and advantages of the present invention are illustrated by way of example and are by no means intended to limit the scope of the present invention, the particular embodiments of which are described in the following figures as follows:

FIG. 1(*b*) is a schematic diagram of a portion of the CAM array of FIG. 1(*a*);

FIG. 1(*c*) is a schematic diagram of a ternary cell;

FIG. 2(*b*) is a diagram of a row in a CAM array according to another embodiment of the present invention;

FIG. 3(*b*) is a timing diagram of a search operation in the CAM of FIG. 3(*a*);

DETAILED DESCRIPTION OF THE PREFERRED EMBODIMENTS

Figure 1A:
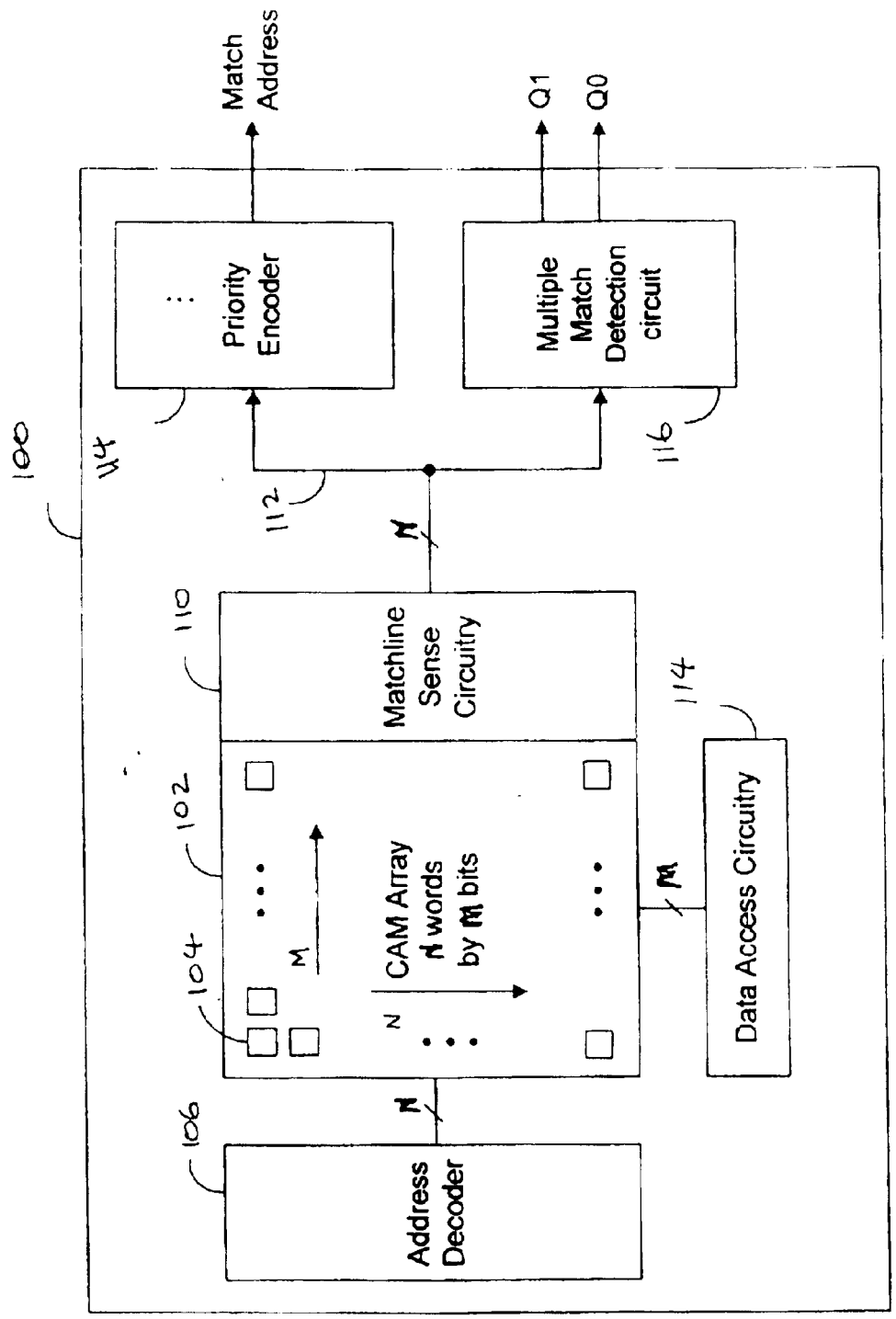
FIG. 1(*a*) is a simplified block diagram of a typical CAM.

In the following description like numerals refer to like structures in the drawings.

Referring to FIG. 1*a* there is shown a simplified block diagram of a typical CAM 100 illustrating only the main elements which will be discussed with reference to the present invention. It will be understood by those skilled in the art that a CAM device comprises many other blocks for a variety of other functions which are not directly related to the present invention and have therefore been omitted for simplicity. The CAM 100 includes an array 102 of CAM cells 104 arranged in rows and columns, and where the cells in each row are coupled to a common match line (ML). In the case of a ternary CAM, each cell stores one of three states: logic "one" otherwise referred to as logic 'H', logic "zero" otherwise referred to as logic 'L', and "don't care" otherwise referred to as 'X', to actually store two bits of data. Generally, each row of CAM stores a word of data. An address decoder 106 is used to select any row within the CAM array 102 to allow data to be written into or read out of the selected row although most commonly, data is written or loaded into the CAM. Bi-directional data access circuitry 114 transfers data between the CAM array 102 and the CAM chip data pins (not shown) for access by an external processor (not shown). Adjacent the CAM array 102 is the match line sense circuitry block 110, which comprises N match line sense circuits and is used during search and compare operations for outputting an N-bit result 112. The match line sense circuit block output for all rows is processed by a priority encoder 114 to generate a highest priority match address (i.e. lowest physical address) corresponding to the location of matched words. A multi-match detection circuit 116 is also coupled to receive the outputs from the match line sense circuitry 110 and in tun generates a two-bit output Q0, Q1 representing the cases where there are no matches, only one match or multi-matches.

Figure 1B:
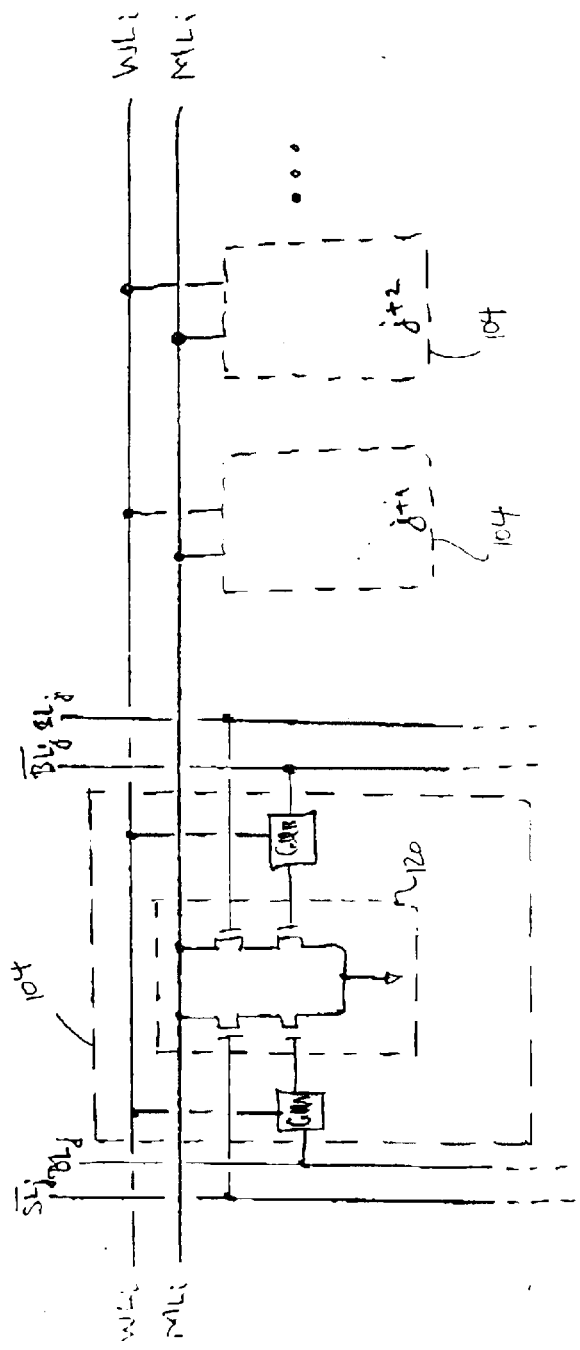
Figure 1B:
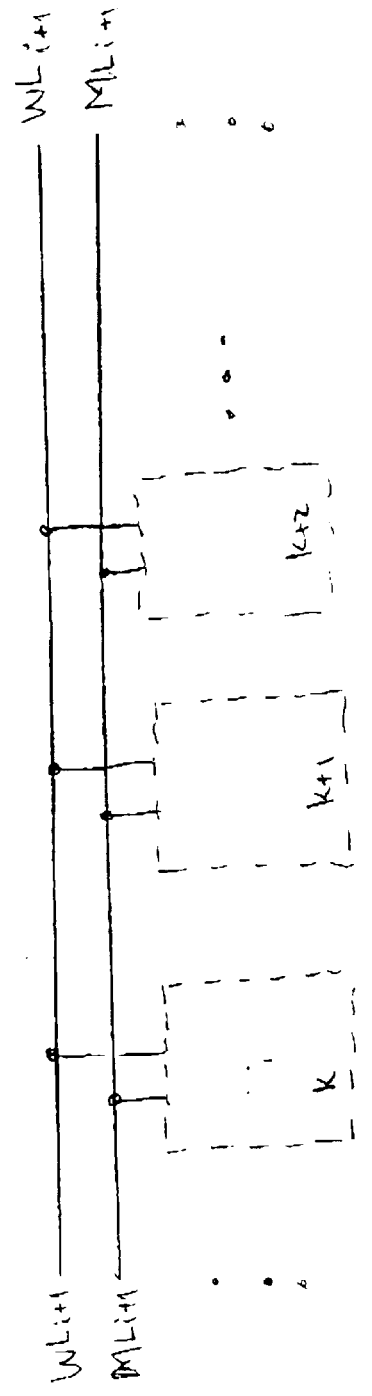
Figure 4C:
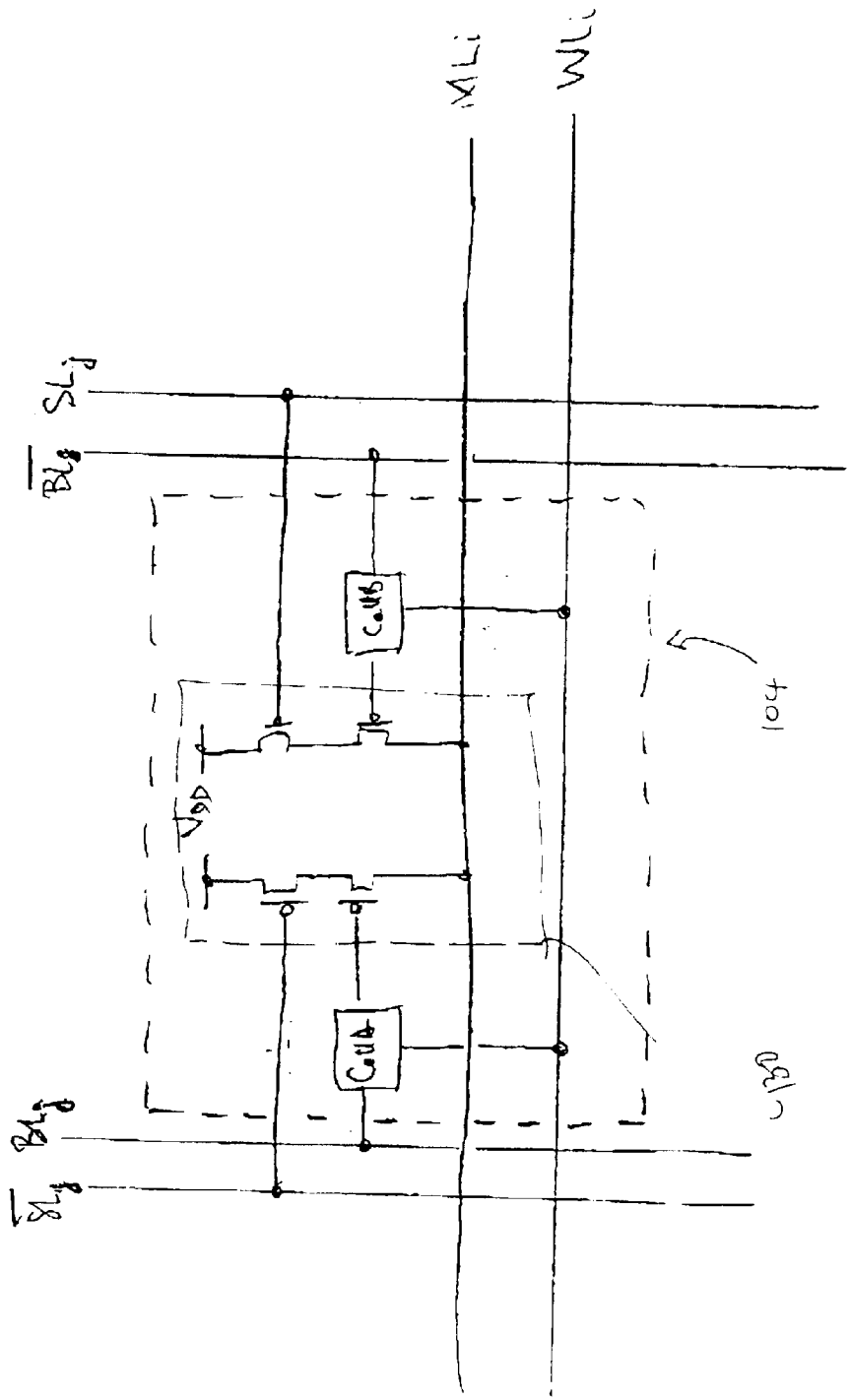
FIG. 4 is a diagram of self-timed embodiment of the invention.

Referring now to FIG. 1*b*, there is shown a small subset (i and i+1) of an array of cells of a ternary CAM. As shown, each row of (i, i+1) cells in the array forms the data word with each cell 104 in row i coupled to a match line $ML_i$. Each ternary cell 104 (j, j+1 . . . ) contains two storage elements cell A, cell B for storing two bits as well as exclusive-OR (XOR) comparison transistors 120 for comparing the stored bits with the search bits. The storage elements cell A, cell B can be of any type of static random access memory (SRAM) or dynamic random access memory (DRAM) cells, both of which are well known in the art (a 6-transistor SRAM cell implementation would clearly require an extra pair of complementary bit lines as will be evident to one skilled in the art). The XOR transistors 120 are n-channel devices that pull the match lines $ML_i$ towards ground in case of a miss.

The general architecture of a CAM array has so far been provided as background for framing the specific problem solved by the present invention. Moreover, in the following description, embodiments of the present invention will be discussed in the context of the CAM architecture 100 for simplicity only. It is to be understood that embodiments to the present invention are equally applicable to other content addressable memories having other configuration and/or employing any suitable CAM cells. Furthermore, the logic level assigned to various signals in the description below are arbitrary and therefore may be modified by reversing the polarity of the associated device as desired. For example, as shown in figure (c) is an implementation of a p-type XOR circuit 130.

Figure 2A:
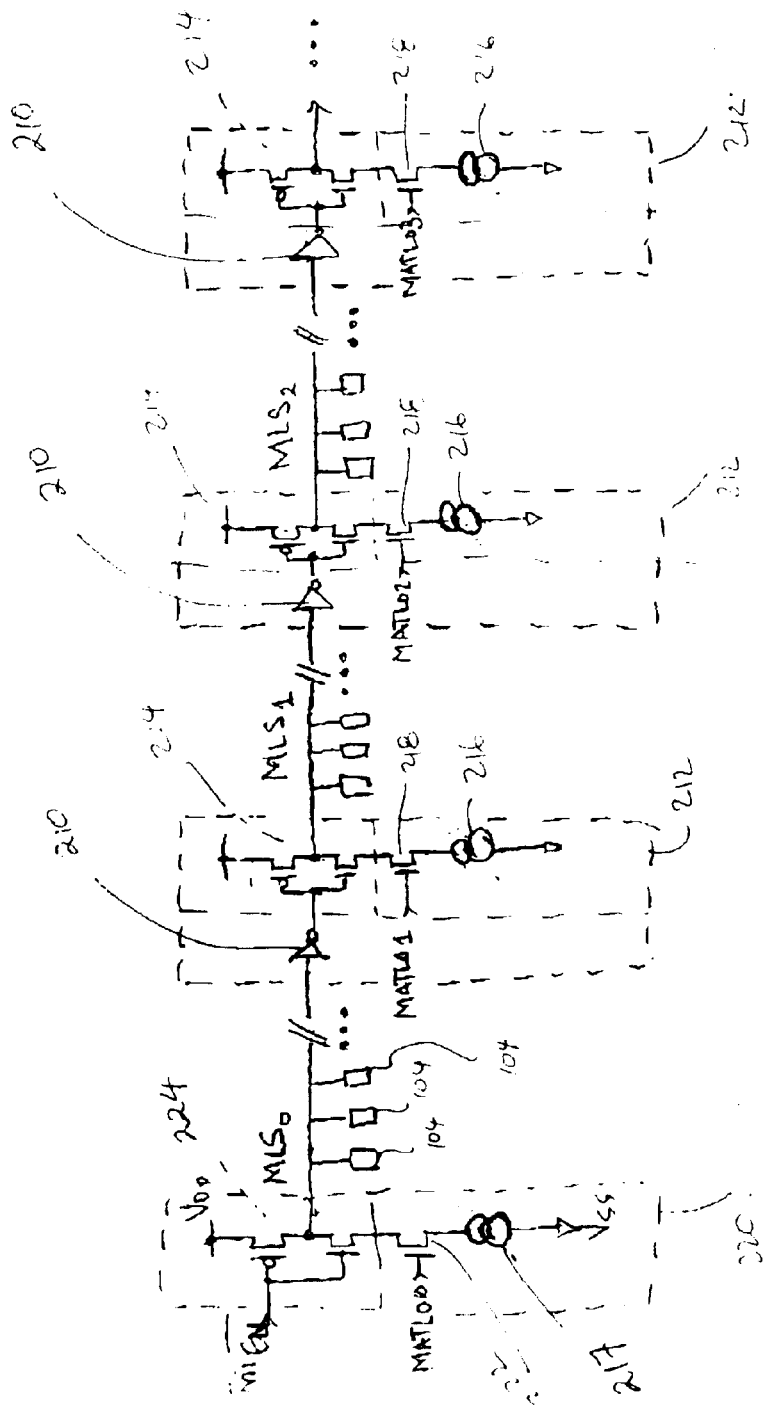
FIG. 2(*a*) is a block diagram of a row in a CAM array according to an embodiment of the present invention.

Referring now to FIG. 2(a) there is shown a schematic diagram of a segmented match line in a selected row of a CAM according to an embodiment of the present invention. For clarity, the bit lines, word lines, search lines and associated circuitry are not shown. The n-bit (e.g., 72-bit) match line is divided into a plurality of match line segments $MLS_0, MLS_1, \ldots, MLSn$ each for example 18-bits long (in this first embodiment therefore there are 4 match line segments, each 18-bits long, making up the 72-bit wide word). Each of the segments $MLS_0$-$MLSn$ are coupled at one end to respective sense amplifiers 210. In the embodiment of FIG. 2(a) the sense amplifiers 210 comprise a CMOS inverter sense amplifier. A more sophisticated sense amplifier circuit can be used to provide a lower-threshold sensing capability and therefore higher speed operation. Each CMOS inverter sense amplifier 210 output is connected to a respective match line strap circuit 212 consisting of a controlled inverter 214 connected in series with a current source 216, the controlled inverter 214 of the match line strap circuit consisting of serially coupled P and N channel devices along with an additional match line strap enabling N-channel device 218. The gate of each of the match line strap enabling N-channel devices 218 is controlled by a corresponding signal match line segment enabling signal MATLO1, MATLOn, where n is the number of bit line segments in a row. The match line segment enabling signals MATLO are activated and deactivated in a sequential manner as will be described in further detail below. As seen in FIG. 2(a), the first segment $MLS_o$ is coupled to match line head circuit 220, also consisting of a controlled inverter 224 connected in series with a current source 216. The inverter 224, is also controlled by an enabling N-channel device 222, which is in turn controlled by an enabling signal MATLO0. A general enable signal, for example MLEN\, can be used to enable all segments simultaneously with the first segment and maintain all segments activated until the entire word has been searched, but such an approach would consume more power than the preferred embodiment illustrated in FIG. 2.

Each of the segments $MLS_0$-$MLSn$ can have an equal number of bit cells 104 however, the number of bit cells can be selected based on statistical power distribution principles. In the CAM shown in FIG. 2, the cells are P-channel type SRAM-based CAM cells as illustrated in FIG. 1c in which the match line is pulled towards VDD, the positive supply, in the case of a miss. In the first segment $MLS_0$ the match line head circuit 220 precharges the first segment to a miss condition. In the case of the match line head circuit 220, the P-channel and N-channel transistors of the controlled inverter 224 are controlled by match line enabling signal MLEN\ which is generated at the beginning of the search operation.

The operation of the segmented match line of FIG. 2(a) may be explained as follows. Prior to beginning a search operation, all match line segments $MLS_0, MLS_1, \ldots, MLSn$, in a matchline, are precharged to a miss state, i.e. in this embodiment, precharged to logic 'H' through the P-channel pull-up transistors in each of the match line strap circuits 212. The match head circuit 220 will begin the precharge with the MLEN\ signal being asserted to logic 'L' thereby turning on the P-channel device in the inverter 224 of match line head circuit 220. As a result, the first match line segment $MLS_0$ is precharged to logic 'H' and this first segment provides the logic 'H' signal to the first inverter 210 and the first match line strap circuit 212 which essentially acts as a repeater and propagates the logic 'H' to $MLS_1$. The inverter of the second segment $MLS_1$ and the second match line strap circuit performs the same function and so forth until the entire match line is precharged to a logic 'H' i.e. the miss condition.

At the start of a search operation, the MATLO signals are held at logic 'L' and search data is applied to the search lines (not shown). The comparison of search and stored data is initiated by the MATLO0 signal of match line segment $MLS_0$ being asserted to logic 'H' whereby, the current source in the match head circuit 220 is enabled. The result of the search of the first match line segment can yield a miss or a match.

In a first instance, a miss in the first segment will result in $MLS_0$ segment remaining at the precharged to miss state, i.e. will remain at logic 'H' level since there will be at least one cell which will provide a conduction path between the match line segment and the precharge voltage VDD. This single conduction path between the match line segment and VDD will create a larger current than the current provided by the current source 217 of the match line head circuit 220 and will therefore override the current source current. As a result, the input signal to the inverter 210 of the first match strap circuit is logic 'H' maintaining the output of the match strap circuit to the subsequent segments logic 'H', thereby disabling the searching of subsequent segments.

In a second instance, if a match is detected in the first segment $MLS_0$ then the level on that segment will begin to be pulled to a logic 'L' by the match line head current source current creating a pull-down path to ground. When this level reaches the switching threshold of the inverter sense amplifier 210 of the first segment, the inverter sense amplifier switches its output from a logic 'L' to a logic 'H', which in turn forces P-channel pull-up transistor of the first match line strap circuit 212 to be turned off and enables the pull-down path for the following segment $MLS_1$, assuming that the next segment match line strap enable signal MATLO1 is already enabled. As previously mentioned, all MATLO signals may be activated simultaneously to a logic 'H' or they may be activated in sequence as will be described in further detail below. As a result, each match line segment uses the search result of the previous segment to determine whether to continue to search along the match lines. This process repeats along the entire length of the match line from $MLS_0$ to MLSn after which a final match result of a match line is provided to a priority encoder for further processing.

In general therefore, the search result of a preceding match line segment is used to enable searching of the next match line segment. If there is no match in one segment, the next and all remaining segments remain precharged to the miss state. If there is a match in a segment, that match result is propagated to the next segment and searching for a match in a subsequent segment ensues and the search will continue onto the next segment until the last segment is searched.

In the above general description, the activation and deactivation of the MATLO match line enabling signals was referred to as being sequential. Each enabling signal can be activated to essentially coincide with the search result from a previous segment and deactivated once the search result is obtained. Alternately, all segment enabling signals can be activated simultaneously and deactivated in sequence once a previous segment has completed the search.

Figure 2B:
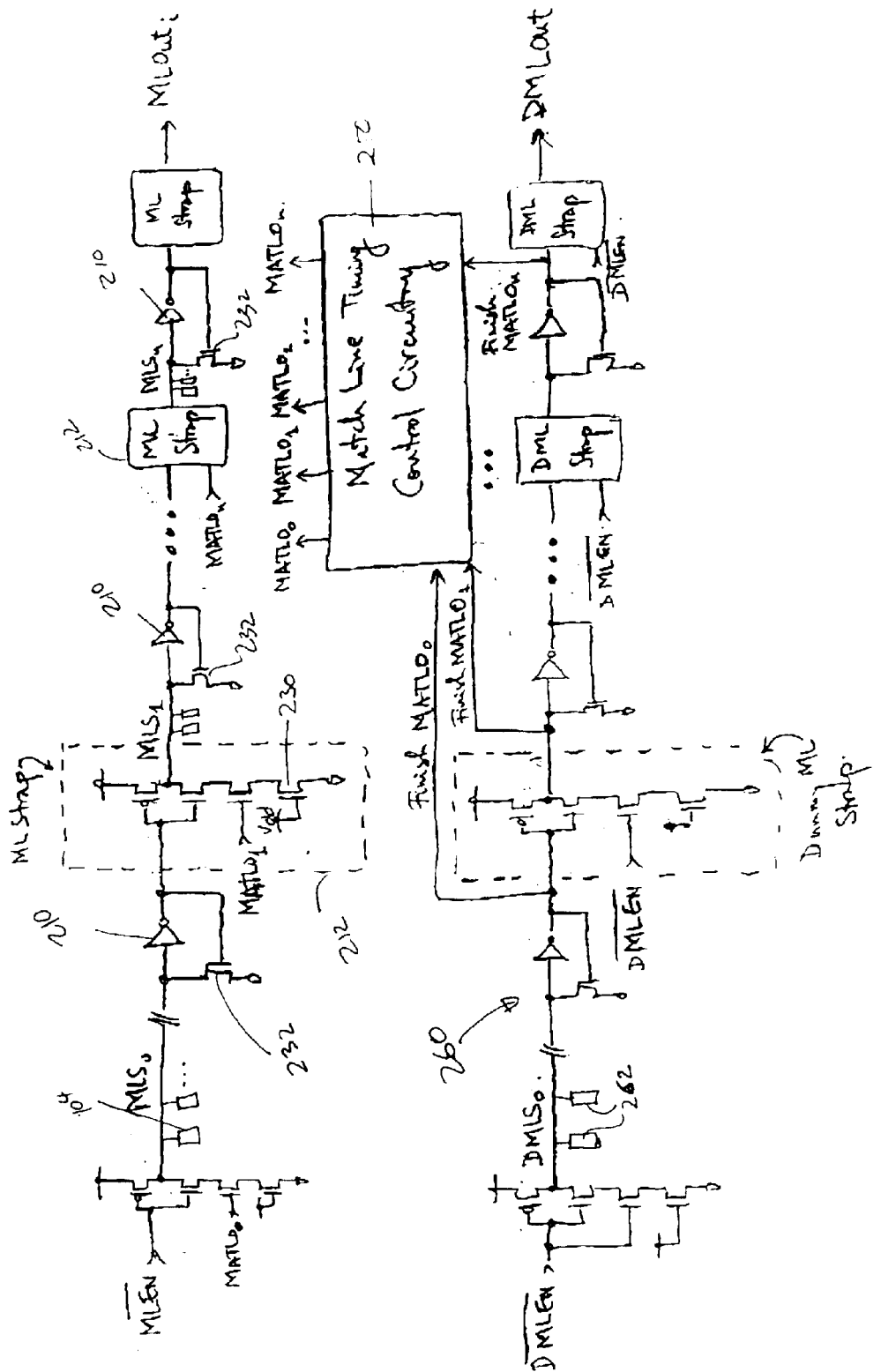

Referring to FIG. 2(b) there is shown a circuit for generating segment enable signals in accordance with the approach described above. Once again, the typical match line MLi is segmented into n-segments as in FIG. 2(a), with the current sources 216 being implemented with an N-channel transistor 230 with its gate tied to VDD. Each segment has its associated match line strap circuit 212 as discussed in FIG. 2(a) as well as a "sticky" latch comprising the inverter sense amplifier 210 and an N-channel pull-down transistor 232 to hold the match condition, i.e. when a match line segment is discharged to ground. The "sticky" latch holds the logic "L" level on its associated match line segment, through the feedback connection between inverter 210 and pull-down transistor 232, even after the match line segment enable signal MATLO for the associated segment has been disabled.

Each segment receives its associated match line enabling signal $MLS_0$, . . . MATLOn from a Match Line Timing Control Block 250. The timing control block 250 is coupled to receive timing signals four a reference or dummy match line 260 which is also segmented into n-segments. The dummy match line segments $DMLS_0$ . . . $DMLS_N$ are identical to the normal match line segments, i.e. also having associated dummy match line strap and match line head circuits with the exception that both the dummy match line head and dummy match line strap circuits receive a dummy match line enable signal DMLEN\, generated by search control circuitry (not shown) at the beginning of a search operation. The dummy cells 262 connected to each dummy match line segment are all hard-wired to the match condition, i.e. for a P-channel SRAM CAM cell implementation shown in FIG. 1(c), all gates of the search and compare XOR gate are hard-wired to VDD.

The function of the dummy match line is to duplicate the operation of a normal match line in order to generate the appropriate timing for deactivating corresponding normal match line segments. By detecting a match condition on a dummy match line and timing the deactivation of current sources of associated normal match lines based on the sense timing of the dummy match line, the appropriate amount of time will be allocated for sensing normal match line segments and also match line sensing will be deactivated in completed segments to reduce power consumption. In addition the use of a dummy match line for this self-timing of the normal match lines ensures uniform timing for all associated match line segments independent of process or temperature variations.

The general operation of the self-timed match line segments discussed in FIG. 2(b) described as follows. The operation of the segmented match line was previously described with reference to FIG. 2(a). The additional control feature of the embodiment shown in FIG. 2(b) is the timing of the activation of the MATLO signals.

During precharge, both the normal match line segments as well as all dummy match line segments are precharged to the miss condition as previously described. When a search command is received by the CAM, search control circuitry (not shown) asserts the normal match line enable MLEN\ signals and dummy match line enable DMLEN\ signal which enable the match line head circuits 220 as well as all dummy match line strap circuits 212. Search data is provided on the search data path (not shown) and searching begins in the first match line segment. The match line timing control circuitry asserts the match line head enabling signal MATLO0 to enable sensing in the first match line segment. Simultaneously, the match line timing control circuitry 250 also asserts the enable signals for all other segments MATLO1-MATLOn in order to provide the fastest possible flow-through path for the search result from one segment to another.

The reasoning for activating all segments simultaneously is that statistically, if there is a miss in the first segment, matches will not likely be found in subsequent segments along that match line. Once the hard-wired match condition has been detected, i.e. a logic 'L' on the first dummy match line segment DMLS0, a signal Finish MATLO0 is asserted by the output of the inverter sense amplifier. The Finish MATLO0 signal is provided to the match line timing control circuitry which in turn de-asserts the match line head enable signal MATLO0 and thereby deactivates the first match line segment MLS0. Once a match result is detected in the second dummy match line segment, the Finish MATLO1 signal is provided to the match line timing control circuitry 250 which in turn deactivates the second normal match line segment MLS1. The dummy match line segments continue to sense and provide Finish MATLO signals in this manner until all the dummy segments have been sensed, thereby providing sequential deactivation of the corresponding normal match line segments. Alternately, the segments after the first segments could be deactivated only after the last segment has been searched and sensed.

It should be noted that by segmenting match lines into a plurality of segments as has been described above and also selectively controlling the activation and deactivation of each match line segment in combination with a precharge to a miss condition on each match line segment, significant power savings can be achieved. Furthermore, the flow-through of the search result from one segment to the next allows for very fast search operations. As word widths increase, this approach can be expanded through the use of pipeline stages between groups of match line segments as will be described in more detail below.

Figure 3A:
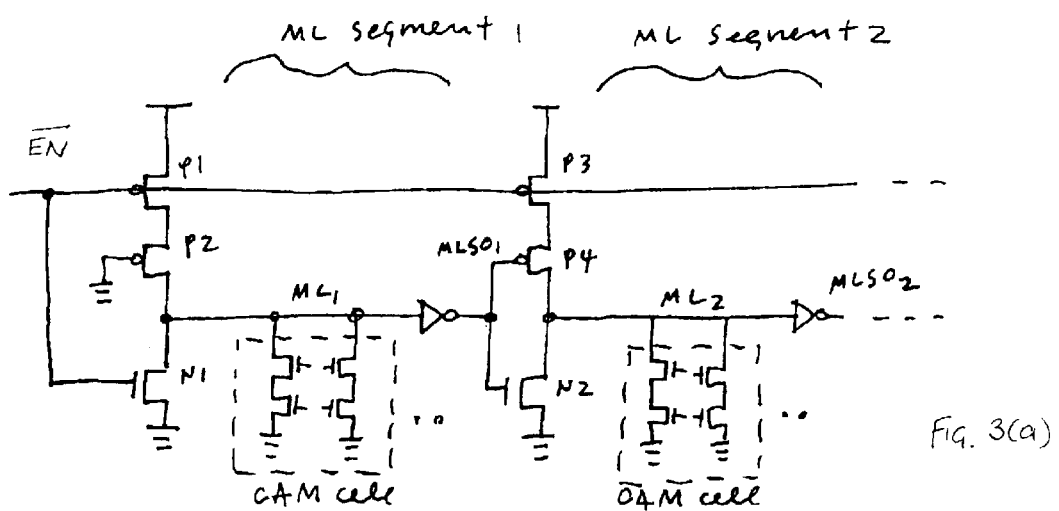
FIG. 3(*a*) is a diagram of a row in a CAM according to yet another embodiment of the present invention.

Referring to FIG. 3(a) there is shown another embodiment of the invention which includes N-channel ML exclusive-OR pull-down devices. Typical ternary CAM cells are illustrated for simplicity only using the exclusive-OR pull-down transistors. Each match line strap circuit 212 comprises a p-channel current source transistor and an inverter connected in series (for example, P3, P4, N2 respectively). The match line head circuit has its middle P-channel transistor hard-wired to ground. Each match line segment ML1, ML2, etc. has an associated inverter sense amplifier as shown in FIG. 2(a) and the output of each inverter sense amplifier is denoted as MLSO1, MLSO2, etc. An enable signal /EN is provided simultaneously to all match line strap circuits.

The general operation of this embodiment will now be described with reference to FIG. 3(a) as well as with reference to timing diagram in FIG. 3(b). During precharge, the enable signal is at logic 'H' and therefore precharges all match line segments to the miss state. The precharge ripples through to all matchline segments as described with reference to FIG. 2(a). While the enable signal /EN is high, new search data can be provided to the search data path (not shown). When the /EN signal is asserted to logic 'L', the first match line segment ML1 is enabled. Transistor P2 is sized such that a single bit miss will keep the match line segment at logic 'L', i.e. the match line will remain in the precharged to miss state. Therefore, P2 must have significantly weaker current drive capabilities than any two series pull-down exclusive-OR devices in the CAM cell. In the case that all cells on the match line segment match, then the match line segment ML will rise slowly to the logic 'H' i.e. to the match state. The relatively slow rise is due to the relatively weak device P2. Once ML1 exceeds the switching threshold of the static match line segment sense amplifier (a simple inverter is shown although a more sophisticated circuit could be used to provide a lower threshold and therefore higher speed operation); the second matchline segment is released.

Figure 3B:
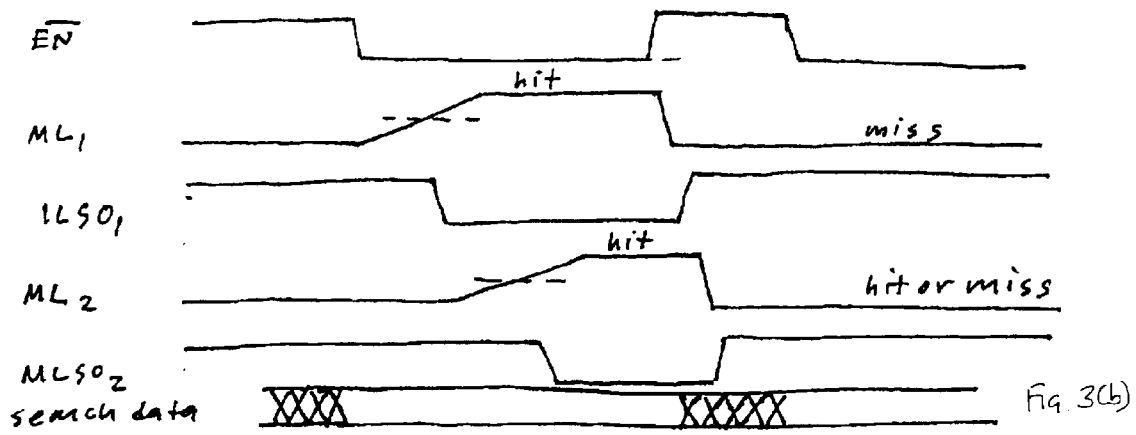

Referring to FIG. 3(b), the timing diagram shows a first search in which there is a match in the first segment followed by a match in the second segment. Any number of segments can be implemented with the only limitation being speed (match line segments 1 and 2 are shown in FIG. 3(a). As long as a match result has sufficient time to propagate through all match line segments during one /EN low period (typically one clock cycle), the embodiment shown in FIG. 3(a) will properly provide flow-through operation of the search result through the match line segments. FIG. 3(b) also shows a second search in which there is a miss in the first match line segment. As a result, no further signal transitions occur in the following segment, resulting in power savings.

As previously mentioned the benefits of segmenting match lines using this approach include savings in power consumption trough the elimination of unnecessary signal transitions after a miss is detected in preceding segments; higher speed of operation where matchline resistive/capacitive RC delay is a concern (this technique reduces delay to RC/n, where n is the number of segments and RC is the time constant of the fill match line ML before segmentation). In addition, for deep sub-micron processes the leakage of devices in the "off"-state can be significant, particularly where 72-bit or 144-bit CAM cells may be connected to a single match line. If this aggregate leakage current approaches that of a single bit miss, it will be impossible to discriminate between a match and a miss. By breaking the matchline into several segments, the number of potential leakage paths connected in parallel is reduced and the problem is solved.

Figure 4:
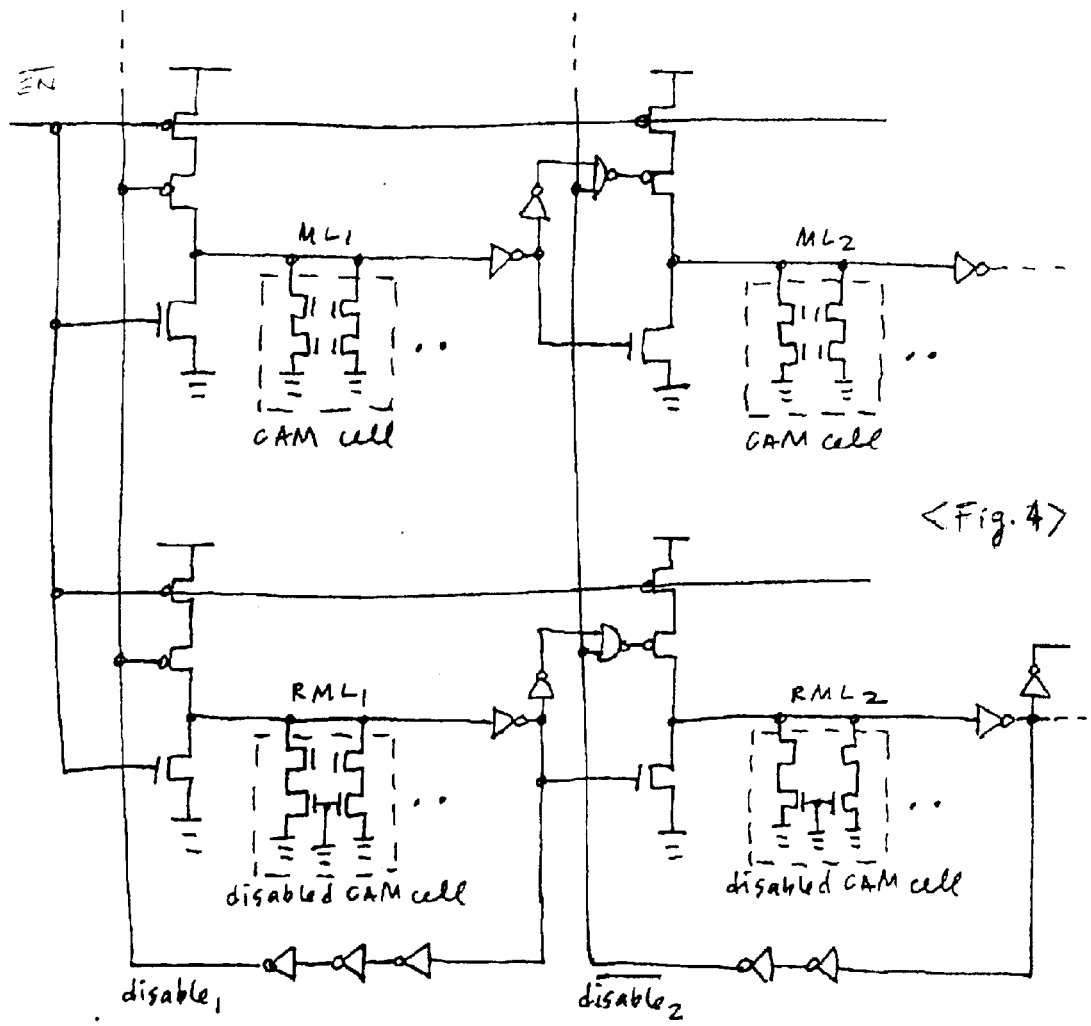

In the case of a miss in a match line segment, there will be static current flowing between the enabled p-channel pull-up in the associated match line strap circuit and one or more of the series pull down paths in the CAM cells themselves. This wasted current can be eliminated by disabling segments registering a miss and all subsequent segments. Such disable signals are generated directly by a reference or dummy match line according to another embodiment of the invention, as shown in FIG. 4. It should be noted that the term reference match line and dummy match line are used interchangeably and represent the same structure. As explained with reference to FIG. 3, the reference match line has an identical number of cells and match line strap circuits to match the capacitance of a normal match line but all the CAM cells are internally hard-wired to '0' data, so that match conditions are created. When the match is detected on the reference match line segment, the current in all associated normal match lines in that segment is cut off through the associated DISABLE signal. The associated DISABLE signal is also used to disable the reference match line segment through the feedback connection shown in FIG. 4.

There should be sufficient timing margin between the time a match line exceeds the match threshold detectable by its associated inverter sense amplifier and the time the p-channel current sources are turned off, to allow for any discrepancies between active match line segments and the associated reference match line segment. This can be accomplished by either tine delay through the inverter chains driving the disable signals, or by designing a lower switching threshold in the regular matchline sense amplifiers and a higher switching threshold in the reference matchline sense amplifier.

Another approach to shutting off current sources is to use only the output of the final stage of the reference match line to shut off all stages of the segmented match line array as briefly mentioned with reference to FIG. 2(b). Somewhat more power will be wasted because earlier stages will be enabled for a longer period of time but a more simple deactivation scheme will result.

Figure 5A:
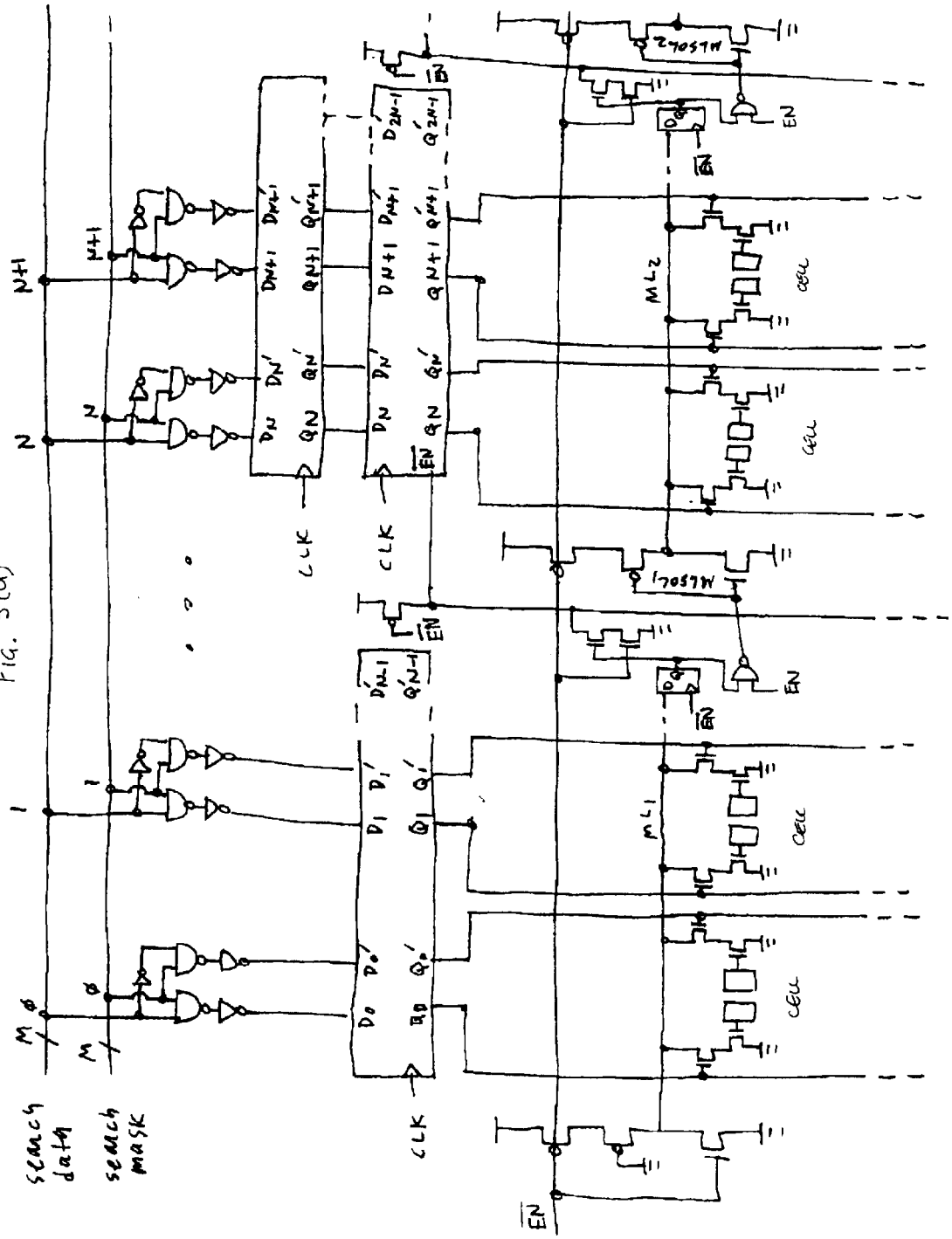
FIG. 5(*a*) is a diagram of a pipelined CAM according to yet another embodiment of the invention; and, FIG. 5(*b*) is a timing diagram showing a search operation in the CAM of FIG. 5(*a*).

Referring to FIG. 5(a), there is shown a still further embodiment of the invention for achieving higher speed operation. In this embodiment, each match line segment has an entire clock cycle to complete the search and compare operation per segment. Accordingly, each match line segment is pipelined so that an entire clock period is available to develop a miss or match indication. The static match line sense amplifier associated with each match line segment previously implemented as an inverter in the embodiments of FIG. 3 and FIG. 4 is replaced by a D-type flip-flop which is clocked by the enable signal /EN and stores the result of the search for its respective match line segment. Alternately, as stated previously, a more sophisticated sense amplifier could be used and then the output of the sense amplifier would be latched.

Also shown in FIG. 5(a) is a register comprised of multiple D-type flip-flops (one D-type flip-flop per column of CAM cells) and associated logic gates for connecting the search data path to each CAM cell. By introducing the register in the search data path, search data can be selectively provided to the next segment only in case a match result has been found in a previous segment. Alternately, in case of a miss in the previous segment, search data is not enabled to pass to CAM cells of subsequent segments resulting in significant power savings. Search data and mask information is converted to ternary format and latched by the D-type flip-flops to drive the search lines accessing all rows of CAM cells in each array. For the first segment, i.e. the segment driven by the match line head circuit, the search data signals are unconditionally latched since there is no previous segment search result. The match result is clocked into a D-type flip-flop at the end of the comparison operation by the rising edge of /EN.

Search data for the second pipeline stage, i.e. the second match line segment, is latched unconditionally in a first register in the same way as in the first stage. However, in order to use the search result of the previous stage to determine whether to continue to search, an additional register is required to delay the search data until the first stage match/miss indication is available. This second pipeline stage is a register comprised of multiple D-type flip-flops each of which is enabled by a result representing all the first segment match results as will be described in more detail below, i.e. its outputs only change when the /EN input is low. This prevents the search data from changing when the previous stage result was a miss, and thereby saves the considerable CV power that would have otherwise been dissipated in unnecessary transitions on the search lines. For each additional ML segment, a further stage of pipelining must be added to the search data path. Only the final stage needs to be controlled by a matchline detect signal.

The search data registers are enabled by a wired-OR circuit controlled by all match lines in the segment of the array. A match on any match line segment in that array segment will pull the \SLDEN signal to logic 'L' to allow new search data to be clocked through to the search lines. The wired-OR node is precharged by /EN while compare operations are taking place on the match line segments.

The self-timed shutoff to the p-channel current sources discussed with reference to FIG. 4 can also be added to this embodiment in order to save even more power.

Figure 5B:
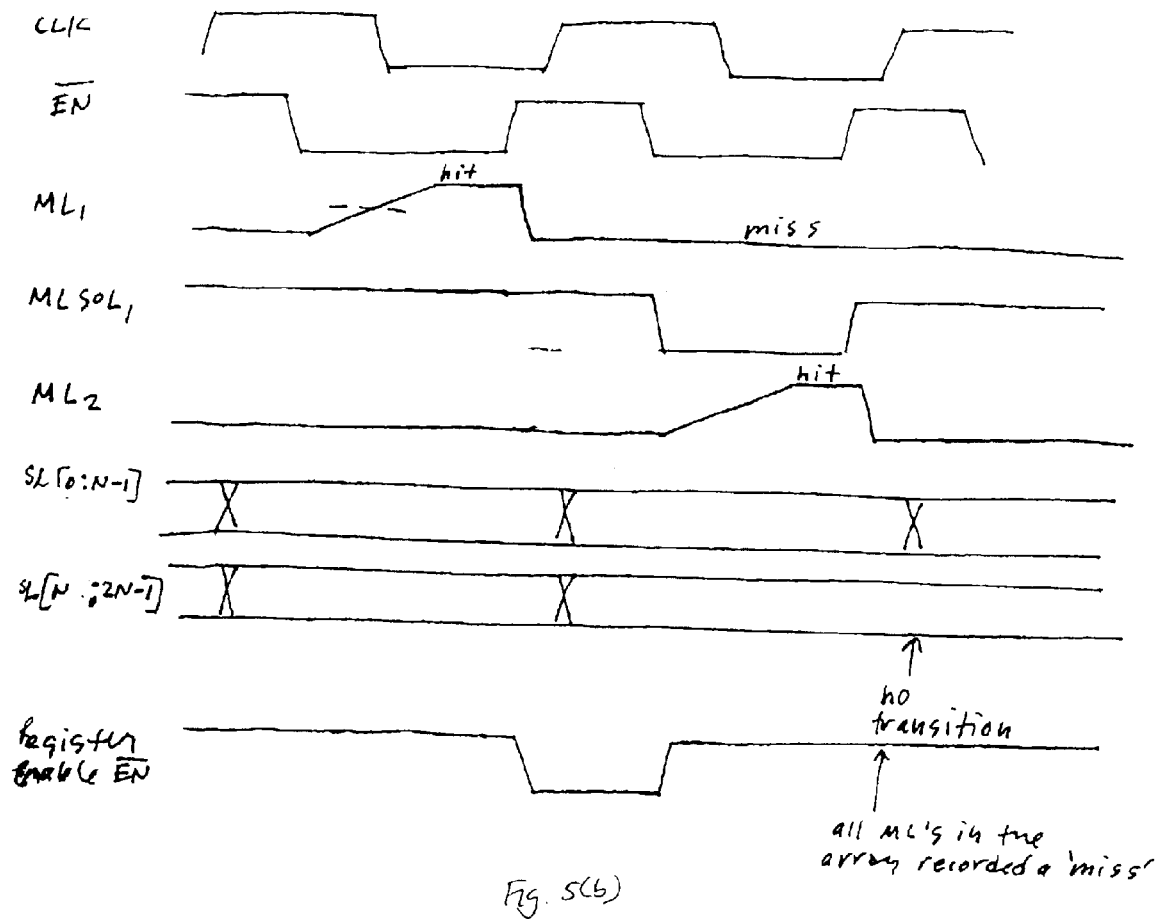

FIG. 5b illustrates the general timing of operation for the embodiment of FIG. 5a.

While the invention has been described in connection with a specific embodiment thereof and in a specific use, various modifications thereof will occur to those skilled in the art without departing from the spirit of the invention.

The terms and expressions which have been employed in the specification are used as terms of description and not of limitations, there is no intention in the use of such terms and expressions to exclude any equivalents of the features shown and described or portions thereof, but it is recognized that various modifications are possible within the scope of the invention.

What is claimed is:

1. A method for selectively enabling, during a search operation, at least one of a plurality of matchline segments within a row of a content addressable memory (CAM) array, each matchline segment having a plurality of CAM cells coupled thereto, the method comprising the steps of:
    (a) setting the matchline segments to a first search result condition indicative of a mismatch;
    (b) evaluating a first matchline segment for a second search result condition indicative of a match; and
    (c) selectively enabling a second match line segment only, in response to the second search result condition in the first matchline segment.

2. A method of claim 1, including propagating the second search result condition in the first matchline segment along the row to indicate a search result condition for the row.

3. A method of claim 1, wherein evaluating the first matchline segment comprises enabling the matchline segment and sensing a voltage level on the first match line segment.

4. The method of claim 3, said step of enabling includes allowing the match line segment to change to a match condition.

5. The method of claim 1, wherein the first condition is a sigh low voltage level on the matchline and the second condition is a low high voltage level on the matchline and the second matchline segment is allowed to discharge to a low voltage level only when there is the second condition in the first matchline segment.

6. A content addressable memory (CAM) including a plurality of rows, each of the rows comprising:
    (a) a plurality of matchline segments having a plurality of CAM cells coupled thereto;
    (b) a circuit for precharging the matchline segments to a first search result condition indicative of a mismatch;
    each said segment including:
        (i) a sense circuit for detecting a second result condition indicative of a match; and
        (ii) a circuit for enabling a current source in a subsequent segment, to detect said second search result condition therein.

7. A method of searching a content addressable memory (CAM) having a plurality of rows of CAM cells, each row being coupled to an associated match line, each match line having a plurality of match line segments, the method comprising:
    (a) precharging the plurality of match line segments to a first condition indicative of a miss;
    (b) searching a first segment in each match line; and
    (c) selectively searching a second segment only if the search of the first segment results in a condition other than the first condition.

8. The method of searching a CAM as claimed in claim 7 further comprising the additional step of selectively searching any segment subsequent to the second segment only if the search of a previous segment results in a condition other than the first condition.

9. A method of searching a content addressable memory (CAM) having a plurality of rows of CAM cells, each row being coupled to an associated match line, each match line having a plurality of match line segments, the method comprising:
    (a) precharging the plurality of match line segments to a "miss" condition;
    (b) searching a first match line segment; and
    (c) selectively searching a second match line segment only if a "hit" condition is detected in the first match line segment.

10. A method as claimed in claim 9 wherein the "hit" condition is propagated through all match line segments indicating a "hit" condition until a "miss" condition is detected causing that segment and any subsequent segments to be disabled.

11. A method of performing a pipelined search operation in a content addressable memory (CAM) having segmented match lines comprising the following steps:
    (a) precharging all match line segments to a "miss" condition;
    (b) searching a match line segment during a first clock cycle;
    (c) searching a subsequent match line segment during a subsequent clock cycle only in case a "hit" condition is detected in a previous match line segment.

12. A method as claimed in claim 11 further comprising the step of disabling a subsequent match line segment in case a "miss" condition is detected in a previous match line segment.

13. A method as led in claim 11 including the step of selectively disabling search line drivers associated with subsequent match line segments once a "miss" condition has been detected in a previous match line segment.

14. The method of claim 1, where the first matchline segment is evaluated in a first clock cycle and the second matchline segment is selectively enabled in a subsequent clock cycle.

15. The method of claim 1, where a plurality of first matchline segments is evaluated in a first clock cycle and a plurality of second matchline segments is selectively enabled in a subsequent clock cycle.

16. The method as defined in claim 1, said first and second segments being adjacent segments.

17. The method of claim 1, wherein the first condition is a high voltage level on the matchline and the second condition is a low voltage level on the matchline and the second matchline segment is allowed to discharge to a low voltage level only when there is the second condition in the first matchline segment.

* * * * *